(12) United States Patent
Haylor

(10) Patent No.: US 6,930,845 B2
(45) Date of Patent: Aug. 16, 2005

(54) DATA WRITING AND READING

(75) Inventor: Phil Haylor, Hampshire (GB)

(73) Assignee: Trix SRT Limited, Hampshire (GB)

( * ) Notice: Subject to any disclaimer, the term of this patent is extended or adjusted under 35 U.S.C. 154(b) by 294 days.

(21) Appl. No.: 10/381,655

(22) PCT Filed: Sep. 28, 2001

(86) PCT No.: PCT/GB01/04361

§ 371 (c)(1),
(2), (4) Date: Apr. 11, 2003

(87) PCT Pub. No.: WO02/27722

PCT Pub. Date: Apr. 4, 2002

(65) Prior Publication Data

US 2003/0184900 A1 Oct. 2, 2003

(30) Foreign Application Priority Data

Sep. 28, 2000 (GB) .............................................. 0023800

(51) Int. Cl.⁷ ................................................ G11B 5/09
(52) U.S. Cl. ............................ 360/39; 360/29; 360/30; 360/40; 360/46
(58) Field of Search ............................ 360/39, 40, 46, 360/29, 30; 375/286–287, 353

(56) References Cited

U.S. PATENT DOCUMENTS

| 4,020,282 A | 4/1977 | Halpern |
| 4,908,722 A | * 3/1990 | Sonobe ........................ 360/46 |
| 5,095,392 A | * 3/1992 | Shimazaki et al. ........... 360/40 |
| 5,408,456 A | 4/1995 | Osoya |
| 5,631,645 A | 5/1997 | Fimoff |
| 5,648,949 A | 7/1997 | Miyamoto et al. |

FOREIGN PATENT DOCUMENTS

| EP | 0 407 031 A | 1/1991 | |
| EP | 0407031 A2 | * 1/1991 | .......... H04L/25/49 |
| GB | 2342259 A | 4/2000 | |
| WO | 96/36122 | 11/1996 | |
| WO | 97/50182 A | 12/1997 | |

* cited by examiner

*Primary Examiner*—David Hudspeth
*Assistant Examiner*—Dan I Davidson
(74) *Attorney, Agent, or Firm*—Nixon & Vanderhye P.C.

(57) ABSTRACT

Method and apparatus for recording data on a magnetic recording medium and writing data to a computer bus in which the data is divided into words of a predetermined length, a signal is generated for each data word, having an amplitude which is representative of the value of the data word, and this signal is then recorded to the magnetic recording medium or written to the computer bus. Complementary method and apparatus is provided for reading the data from the magnetic recording medium and the computer bus.

16 Claims, 6 Drawing Sheets

Fig. 1

| Decimal value | MSB Data bit 7 128 | Data bit 6 64 | Data bit 5 32 | Data bit 4 16 | Data bit 3 8 | Data bit 2 4 | Data bit 1 2 | LSB Data bit 0 1 | Amplitude level (division of maximum Amplitude value) |
|---|---|---|---|---|---|---|---|---|---|
| 3 | 0 | 0 | 0 | 0 | 0 | 0 | 1 | 1 | 3 |
| 47 | 0 | 0 | 1 | 0 | 1 | 1 | 1 | 1 | 47 |
| 59 | 0 | 0 | 1 | 1 | 1 | 0 | 1 | 1 | 59 |
| 255 | 1 | 1 | 1 | 1 | 1 | 1 | 1 | 1 | 255 |
| 187 | 1 | 0 | 1 | 1 | 1 | 0 | 1 | 1 | 187 |
| 60 | 0 | 0 | 1 | 1 | 1 | 1 | 0 | 0 | 60 |
| 9 | 0 | 0 | 0 | 0 | 1 | 0 | 0 | 1 | 9 |
| 19 | 0 | 0 | 0 | 1 | 0 | 0 | 1 | 1 | 19 |
| 233 | 1 | 1 | 1 | 0 | 1 | 0 | 0 | 1 | 233 |
| 99 | 0 | 1 | 1 | 0 | 0 | 0 | 1 | 1 | 99 |
| 128 | 1 | 0 | 0 | 0 | 0 | 0 | 0 | 0 | 128 |
| 64 | 0 | 1 | 0 | 0 | 0 | 0 | 0 | 0 | 64 |
| 120 | 0 | 1 | 1 | 1 | 1 | 0 | 0 | 0 | 120 |
| 35 | 0 | 0 | 1 | 0 | 0 | 0 | 1 | 1 | 35 |

*MSB - Most Significant data bit
*LSB - Least Significant data bit

DATA WRITING AND READING

This application is the US national phase of international application PCT/GB01/04361 filed 28 Sep. 2001 which designated the U.S.

FIELD OF THE INVENTION

The invention relates to writing and reading data, for example within a computer system.

BACKGROUND OF THE INVENTION

Data is required to be written and read in many subsystems within computer systems. For example, in magnetic storage systems, data is written to a magnetic recording medium by a transducer which leaves a magnetic signature within the magnetic material of the recording medium. The data is then read from the magnetic material at a later stage by a further transducer or in many cases the same transducer which detects the magnetic signature within the magnetic recording medium. Components within a computer system also pass data in via bus systems. Such bus systems may interconnect internal adaptor cards, memory, video or peripheral host adaptor cards for example. Other bus systems may interconnect internal or external peripheral units such as scanners, printers or magnetic storage devices for example. A first component writes the data to the bus in the form of a series of changes in voltage or current. Components requiring the data read the data from the bus by detecting these changes.

In all aspects of computer technology there is a continuous requirement for more data storage, for data to be processed faster and for it to be communicated faster. In presently known magnetic storage devices, data bits are stored on the magnetic storage medium using a variety of methods. Such methods include the presence or absence of a magnetic signature on a given area of the medium, analogue frequency representation of corresponding data bits "1" and "0" or in longitudinal patterns of magnetic particles with North-South or South-North magnetic polarity. Such an arrangement of representative data bit "1" and "0" in accordance with the longitudinal magnetic orientation. In order to increase the amount of data stored on a given area of magnetic medium, the data footprint size must be decreased, the number of recording sides must be increased and the recording tracks must be decreased in width and located in closer proximity to each other. However as the areal density increases so does the likelihood of adjacent bits degrading each other's magnetic signatures. In addition, if the bit area is to be reduced, the accuracy of the magnetic head and its positioning system must be correspondingly increased. A further problem for present magnetic storage devices is performance. Faster reading and writing operations can increase performance. Performance increases can be achieved by increasing the speed of which the media surface (also known as the substrate) is passed under the transducer used for writing and reading the magnetic data signatures. Currently, data words are written and read sequentially. Performance increases can be achieved by increasing the rate at which the substrate is passed under the transducer used for writing and reading the magnetic data signatures. However by writing and reading whole data words at a time would result in a significant performance.

In buses of the type presently known bits are transmitted by being written onto the bus at a first location by a first component in the form of the presence of an electric voltage or current and by being read at a second location by a second component which detects changes in the electric voltage or the direction of the electric current. The time interval required to be left between bits is dependent on the signal degradation which in turn is dependent on the cable length, signal shaping and electrical characteristics. As the bus length is determined by several factors, such as signal shaping and electrical characteristics, the achievable bit rate on the bus is limited. Therefore in order to increase the data throughput on a bus it is necessary to increase the bus size, i.e. provide further wires or enhance signal processing, etc. This requires more equipment which increases the cost and the complexity of the bus.

It is an aim of the present invention to alleviate some of the problems described above with conventional data reading and writing methods.

SUMMARY OF THE INVENTION

According to a first aspect of the first embodiment of the invention there is provided a method of reading data from a magnetic recording medium, said method comprising:

reading signals recorded on a magnetic medium;

generating data words each having a value which is represented by the amplitude of a read signal;

combining a plurality of data words to form a sequence of data.

According to a second aspect of the first embodiment of the invention there is provided a method of recording data onto a magnetic recording medium, said method comprising:

arranging data into words of a predetermined length;

generating for each said data word, a signal having an amplitude which is representative of the value of the data word; and recording said signals on the magnetic recording medium.

This is advantageous as it increases the bit density of the magnetic storage medium (and hence the capacity of a given magnetic storage medium) without decreasing the size of the bit storage areas, or increasing the areal density of the magnetic medium. This means that the risk of adjacent bit areas degrading each other's magnetic signatures is not compromised and the accuracy of the magnetic head positioning does not need to be increased. The invention further allows the read-write speed of the storage device to be increased without having to increase the speed at which the magnetic medium is passed under the magnetic head. Similarly, the speed of the substrate can be reduced to prevent large generations of heat or buffer overload. The speed of the substrate may need to be reduced from current levels in order to prevent the generation of heat from affecting the integrity of the data word.

In a preferred embodiment of the invention calibration signals are recorded onto the predetermined regions of the magnetic recording medium. These calibration signals are subsequently read and used to set a plurality of expected signal amplitudes or a plurality of signal amplitude ranges which are used to determine which data word a read signal amplitude represents.

The use of calibration signals is advantageous as it improves the accuracy of the data read from the magnetic recording medium.

In a preferred embodiment of the invention a known signal is read from a predetermined portion of the magnetic recording medium and the noise inherent in the signal is extracted. The inherent noise signal is then injected into the data channel, thereby cancelling at least a portion of the noise in the read data signal.

This is advantageous since it improves the reading apparatus' ability to discriminate between signals of different amplitudes which in turn increases the number of amplitude levels which can be used.

According to further aspects of the first embodiment of the present invention there is also provided apparatus corresponding to the methods described above.

According to a first aspect of the second embodiment of the invention there is provided a method of reading data from a line of a computer bus, said method comprising:

reading signals written on a line of a computer bus;

generating data words each having a value which is represented by the amplitude of a read signal;

combining a plurality of data words to form a sequence of data.

According to a second aspect of the second embodiment of the invention there is a provided a method of writing data to a line of a computer bus, said method comprising:

arranging data into words of a predetermined length;

generating for each said data word, a signal having an amplitude which is representative of the value of the data word; and writing said signals to the line of the computer bus.

This embodiment of the invention is advantageous as it increases the data rate attainable on each line of a computer bus. Therefore a computer bus of the present invention may replace a conventional computer bus using fewer lines but maintaining the same total data rate or the computer bus may be installed with various numbers of lines up to or more than the original number of lines providing a larger data rate.

In a preferred embodiment of the invention calibration signals are written onto the bus either at predetermined times or in response to a control signal. The calibration signals are subsequently read from the computer bus (either at the predetermined time or in response to a control signal) and are used to set a plurality of expected signal amplitudes or a plurality of signal amplitude ranges which are used to determine which data word a read signal amplitude represents The use of calibration signals is advantageous as it improves the accuracy of the data read from the computer bus. If the calibration signals are written onto the computer bus in response to a control signal then it is possible to re-calibrate if an increase in the bit error rate is detected.

According to further aspects of the second embodiment of the present invention there is also provided apparatus for performing the methods described above.

The invention will now be described by way of non-limiting examples with reference to the accompanying drawings.

DETAILED DESCRIPTION

In the present invention a stream of input data is divided into data words which may be of the same length as or a different length from the word length of the input data. Each data word, which is distinguished by its value, is represented by a different quantized analogue signal and each quantized analogue signal only represents that data word. If the data word contains 2 bits there are four possible states: 00, 01, 10, 11. These four data words are represented by signals with four different amplitudes, for example which are proportional to the value of the data words. In the example given the signals' amplitudes would be one quarter, two quarters, three quarters and the maximum possible signal amplitude. However there may be circumstances in which it is desirable to assign the data words to the quantized analogue signals in other ways, for example randomly or quasi-randomly. In addition some of the signal amplitudes may be assigned to provide extra information, such as sector number, track number,-,address mark or error check information.

The writing device determines which of the four possible data words is next in the data stream and writes a signal at the corresponding amplitude. The reading apparatus, when it reads a signal, determines the relative amplitude of the signal and outputs the corresponding two-bit data word. Thus the system is able to write or read the signal two bits at a time compared to the conventional one bit at a time which improves, by a factor of two, the rate at which data can be written and read. In the case of writing and reading data to and from a magnetic recording medium this also increases, by the same factor, the data storage capacity of the medium. Larger data words can be used to secure larger performance improvements.

The table below (Table 1) shows examples of the capacity improvements that may be achieved using the present invention when applied to magnetic recording media. The example given is a Fujitsu M8100—128-Track Tape Drive used with a sustained transfer rate of 13.5 Mbps over a Small Computer Systems Interface (SCSI) bus.

TABLE 1

|  | Current Form | 4 bit data words | 8 bit data words | 12 bit data words | 16 bit data words |
| --- | --- | --- | --- | --- | --- |
| Capacity | 10 GB | 40 GB | 80 GB | 120 GB | 160 GB |
| Bit Density "Bits per inch" (BPI) | 86,360 | 345,440 | 690,880 | 1,036,320 | 1,381,760 |
| Transfer Rate Sustained (Mbps) over SCSI Interface | 13.5 | 13.5 | 13.5 | 13.5 | 13.5 |
| Media Type | 3590 ¼" Tape | 3590 ¼" Tape | 3590 ¼" Tape | 3590 ¼" Tape | 3590 ¼" Tape |

The bit density is measured in Bits per Inch. The improvements in the capacity of the tape store and resulting bit density increase in proportion to the size of the data words used. It is clear that the present invention results in marked improvements.

Table 2, below, shows the improvements in the transfer rate sustained which can be achieved with the present invention, again using a Fujitsu M8100—128-Track Tape Drive, but this time replacing the SCSI Hardware Interface. To illustrate the impact of these improvements, the table also shows the time that would be required to deliver 10 GBs of data to the backup drive unit (assuming that the host computer can deliver the required sustained throughput). Corresponding improvements in the transfer rate of a data bus can be achieved when the present invention is applied to a computer bus.

TABLE 2

|  | SCSI Interface | 4 bit data words | 8 bit data words | 12 bit data words | 16 bit data words |
| --- | --- | --- | --- | --- | --- |
| Transfer Rate Sustained (Mbps) | 13.5 | 54 | 108 | 162 | 216 |
| Time to complete 10 GBs in MM:SS (approx) | 12:00 | 03:15 | 01:30 | 01:00 | 00:47 |

Figure 1:
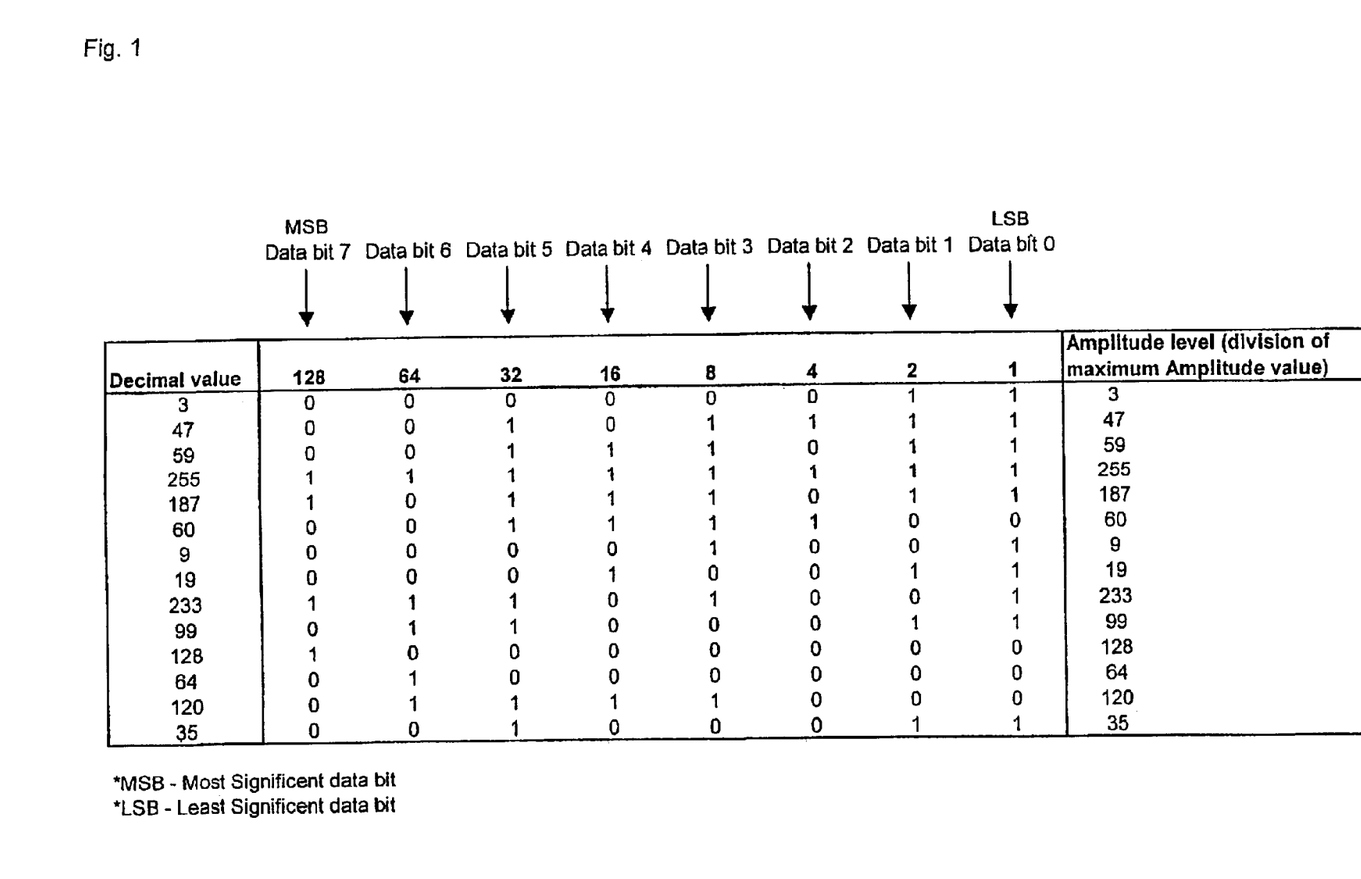
FIG. 1 shows a table of example 8 bit data words and the corresponding amplitudes of signals used in an example of the invention.
Figure 2:
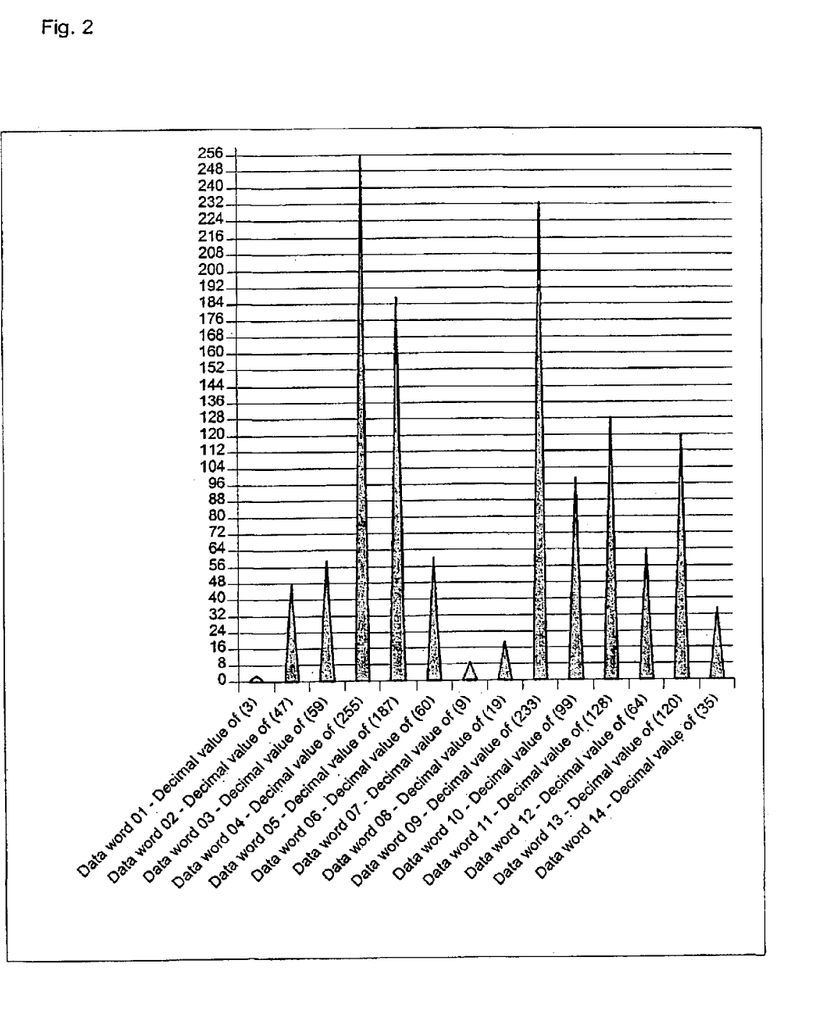
FIG. 2 shows the example 8 bit data words of FIG. 1, graphically represented.

FIG. 1 shows a table of example values for the present invention in which 8 bit data words are written or read simultaneously. In this case the amplitude of the signal is quantized to one of 256 equally spaced levels (0 to 255). FIG. 2 shows the examples in graphical form. It can be appreciated that as the size of the data words written or read in a single step increases the required accuracy of the writing and reading apparatus increases exponentially. Notwithstanding this, the invention is applicable to data words of any size. However, data word sizes are limited by factors other than those directly imposed by the present invention. Such factors, limiting data word size include:

the precision and quality of electronic components used to construct the invention;

the tolerance of a magnetic medium to facilitate recording of a spectrum of amplitude steps;

heat factors and their effect on the integrity of the data.

Figure 3A:
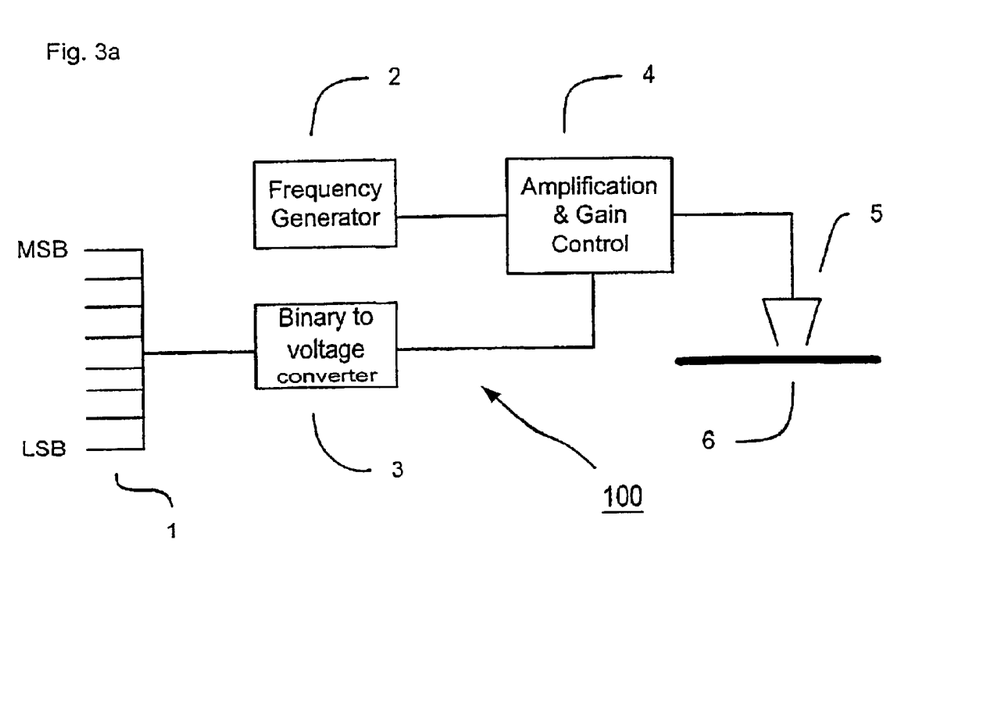
FIG. 3a shows a schematic representation of apparatus according to the first embodiment of the invention for writing data to a magnetic recording medium.
Figure 3B:
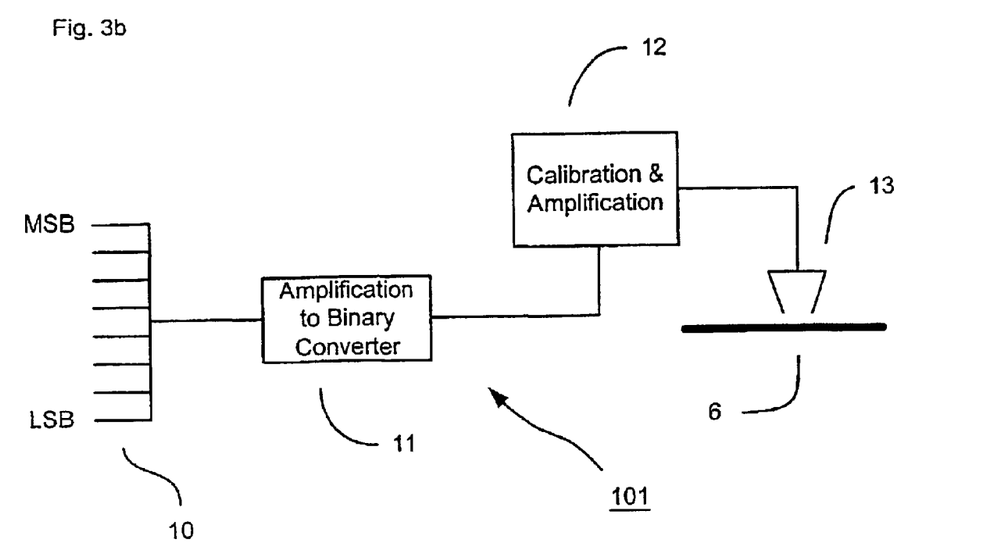
FIG. 3b shows a schematic representation of apparatus according to the first embodiment of the invention for reading data from a magnetic recording medium.

FIGS. 3a and 3b represent the writing and reading apparatus, respectively, of a first embodiment of the invention. In this example binary data is written to and read from a hard drive of a computer. It should be noted however that this, embodiment of the present invention is applicable to any circumstance in which data is recorded onto a magnetic recording medium.

At the input interface 1 between the existing computer hardware and the writing apparatus of the present invention the data may be either serial or parallel and, in the case that the data input is parallel, may be any of two or more bits. The number of bits in the data word used in the writing and reading may be predetermined or may be set by a control signal (not shown) and is not limited to being the same size as the data words of a parallel data input. The input interface 1 therefore contains a data buffer to enable it to arrange the data into data words of the correct size. In the case that the data is in parallel format with the same number of bits as is contained in the data words then the division performed in the buffer will be implicit.

The data words are passed from the input interface 1 to the binary to voltage converter 3 which determines which data word has been received and outputs the corresponding quantized analogue signal, a voltage signal at a proportion of the maximum voltage. The binary to voltage converter 3 operates in a similar manner to conventional Digital to Analogue converters such as Digital to Analogue converter Integrated Circuits, R-2R ladder converters or binary weighted circuits. The output from the binary to voltage converter is fed to the amplification and gain control circuit 4 which amplitude modulates a carrier signal generated by the frequency generator 2. The carrier signal is set at a frequency which can be successfully recorded on the magnetic recording medium 6. The output of the amplification and gain control circuit 4 is the carrier signal at an amplitude determined by the data word originally inputted. The writing transducer 5 then records the signal to the magnetic recording medium.

FIG. 3b shows the reading apparatus which is complementary to the writing apparatus described above. The magnetic signal written on the magnetic recording medium 6 is read by the reading transducer 13 and transferred to the calibration and amplification circuit 12 in which the signal is demodulated to produce an amplitude signal. The amplification to binary converter circuit 11 compares the amplitude signal to the expected signal levels, which may be set by calibration tracks as discussed below, to determine which of the data words the signal represents. The corresponding data word is then outputted from the amplification to binary circuit 11 to the output interface 10 between the reading apparatus of the present invention and the existing computer hardware. As with the input interface 1, the output interface 10 may output the binary data in either parallel or sequential form. A buffer in the output interface enables this as well as permitting the use of data words of a different size to the size to the output.

In a variation of this embodiment of the invention, the quantized analogue signal may be recorded directly onto the magnetic recording medium without modulating a carrier signal.

In a further variation of this embodiment an opto-magneto apparatus is used. In such an apparatus a laser is used to heat the substrate of a magnetic recording medium immediately prior to the transducer recording the signal. The heating reduces the amount of magnetic flux required by the transducer to polarise "in a North-South or South-North fashion" is reduced. This is safeguards the integrity of adjacent data bits as there is less magnetic flux infringing upon neighbouring data bits where high areal density has been achieved. The magnetic particles in the heated region are polarised longitudinally to an angle which is dependent on the "write" current used. According to the present invention the opto-magneto apparatus can be used by using the writing and reading apparatus described above without the use of the carrier signal (or, put another way the frequency of the carrier signal is set to zero). Thus a complete data word is represented by the magnitude of the "write signal" and, on the medium, by the angle of the polarised magnetic particles.

Figure 4A:
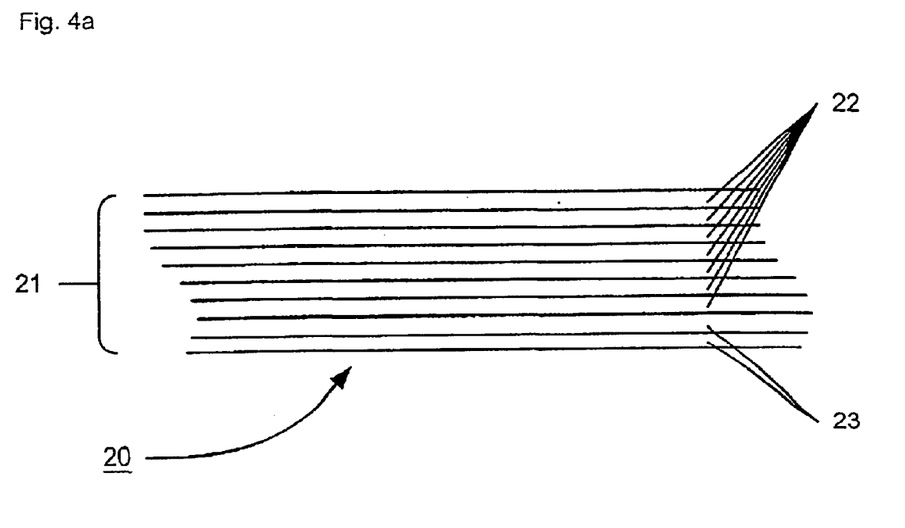
FIG. 4a shows a magnetic recording medium of a first type for use with the first embodiment of the invention.
Figure 4B:
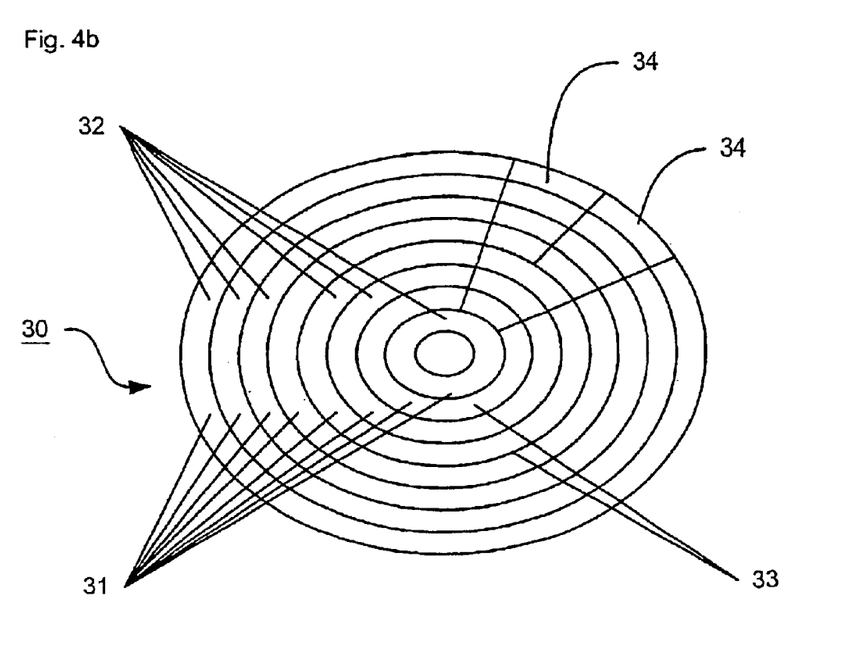
FIG. 4b shows a magnetic recording medium of a second type for use with the first embodiment of the invention.

FIG. 4a shows a section of a magnetic tape 20 which forms an example of a suitable medium for recording signals as described above. The tape 20 is split into discrete recording tracks 21. In a preferred embodiment some of the tracks will be data-containing tracks 22 and the remaining tracks or sections of tracks 23 will be for calibration, sector number, track number, address mark and error check information, etc. FIG. 4b shows a corresponding disc-shaped magnetic recording medium 30 which has recording tracks 31 which may be used as data-containing tracks 32 or as calibration tracks 33. The magnetic discs or tapes may be used in hard drives or be contained in removable cassettes, such as "floppy disks", "Zip disks", "Jaz disks" and "DAT tapes", for use in computers or other electronic equipment.

The calibration tracks 23, 33 may be used to improve the accuracy of the writing and subsequent reading process. Calibration signals representing predetermined data words are recorded at known sections of the calibration tracks 23, 33. The calibration signals are subsequently read by the reading circuit 101 and stored for use in the amplification to binary converter 11. The reading circuit 101 is instructed by a control unit (not shown) to read the calibration signals. This may occur at predetermined intervals, may be triggered to occur as a result of an increase in the bit error rate of the read data or may occur as a result of either.

The calibration signals may be used to provide a plurality of signals with amplitudes representing the possible data words. Data signals are then compared to the calibration signals to determine which data word the data signals read from the data-containing tracks 22, 32 represent. Alternatively the calibration signals may be used to set signal amplitude ranges. A read signal which is within a set amplitude range is then be recognised as representing a particular data word. A read signal which does not fall within any amplitude range could then be recognised as incorrect or uncertain and be subsequently re-read or re-processed or both. Preferably the calibration tacks 23, 33 are recorded onto the medium when the writing apparatus records the data-containing tracks or when the medium is first formatted. Known format operations include writing track information, sector information, address mark information.

The calibration is especially useful since the method and apparatus of the present invention rely on non-saturation magnetic recording and each magnetic medium will respond slightly differently to a given input. This variation, which may be caused by variations between magnetic mediums, by variations between both recording apparatus and reading apparatus and may also change with time, may be large enough that, without calibration, signals may be incorrectly read as representing a particular data word.

An additional improvement can be made in the reading process by compensating for the noise in the signal read from the magnetic recording medium. Inherent noise may be present in the signal due to, for example, variations in the grain size and grain density in the magnetic medium. This is especially true for magnetic tapes in which the stretching of the tape caused by the tension of the tape causes additional variation.

Figure 6:
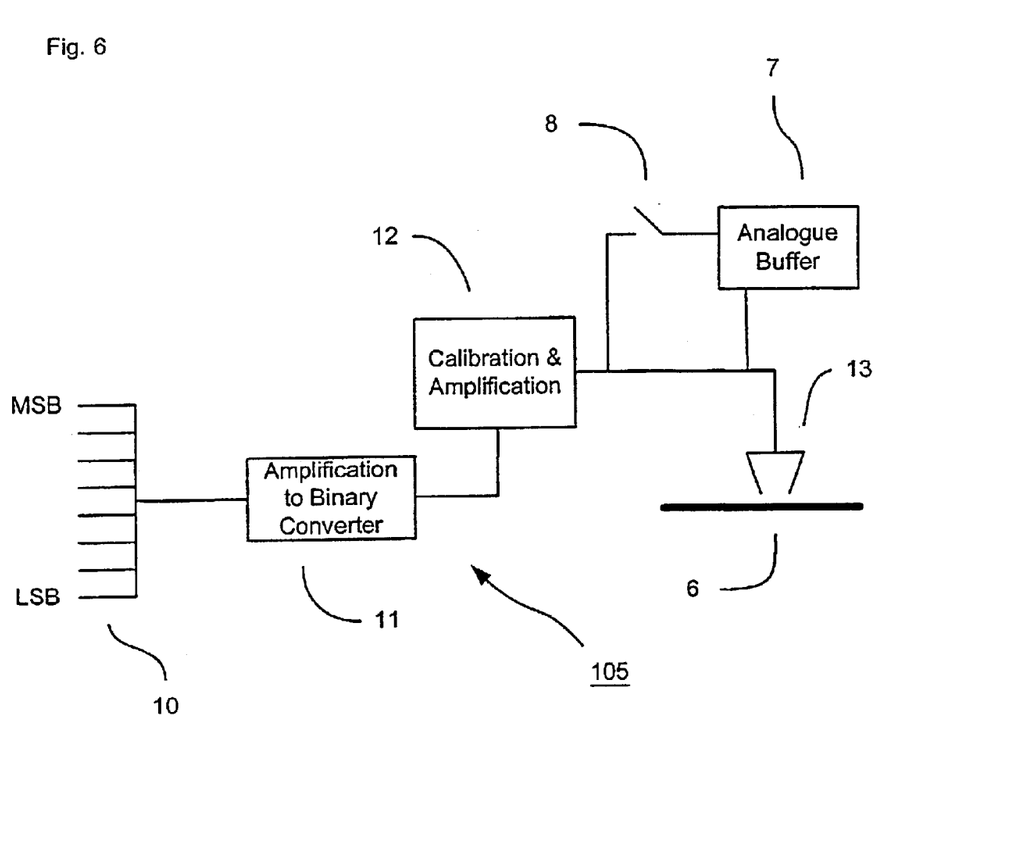
FIG. 6 shows a schematic representation of apparatus according to a variation of the first embodiment of the invention for reading data from a magnetic recording medium.

FIG. 6 shows a variation of the reading apparatus 105 of the first embodiment of the present invention. The apparatus includes an analogue buffer 7. A known noise compensation signal is read from a predetermined portion of the magnetic recording medium 6 and from this the inherent noise is extracted. The known signal may be read from a portion of the magnetic recording medium on which no signal has been recorded. To extract the inherent noise in this case, no further processing will be required. Alternatively it may be a signal recorded at a known level, such as one of the calibration signals. In the latter case, the difference, between the read signal and the signal known to have been recorded will be the inherent noise. Therefore to extract the inherent noise in this case it will be necessary to deduct the known signal level from the noise compensation signal. A sample of the inherent noise extracted from the noise compensation signal is then stored in the analogue buffer. The predetermined portion of the magnetic recording medium may be a designated track, part of a track, a sector or part of a sector depending on the type of magnetic recording medium.

During the read operation, the sample held in the analogue buffer 7 can be injected into the data channel. In doing so it will cancel at least a portion of the inherent noise in the data channel. The analogue buffer 7 is provided with a switch 8 which can be used to apply the sample in the analogue buffer as required.

The analogue buffer may be comprised of components such as a Bucket-Brigade Device (BBD), Delay Line, Analogue Delay Line, Passive Analogue Delay Line, Ditally Programmable Analogue Delay Line or Trimable Analogue Delay Line. It may also be comprised of components that have a hybrid construction utilising proven technologies of active integrated circuitry and of passive networks utilizing capacitive, inductive and resistive elements. The sample in the analogue buffer can be continually re-inputted to itself by means of a loop system. The sample in the buffer can be updated by reading a new known signal from a predetermined portion of the magnetic recording medium periodically or in response to a control signal triggered, for example, by an increase in the bit error rate.

In an alternative apparatus the known signal is continuously read from a predetermined portion of the magnetic recording medium thereby obviating the need for the analogue buffer.

The improvements of this invention to devices for recording data on magnetic storage mediums may be applied to designing entirely new magnetic data storage devices. However it is also intended that existing devices can be modified to incorporate the present invention. For instance this may be possible by installing a new card which interfaces with the internal data bus and utilises the existing magnetic medium, transducers and other mechanics.

A second embodiment of the invention is used to read and write data to and from a computer bus system. The invention may be used with either internal or external computer buses. Internal computer buses are used to host Adaptor and Add-on system enhancement cards which are used, for example, to provide additional memory or improved graphics processing. External, or peripheral, buses are used to connect peripheral devices such as image scanners, printers and magnetic tape backup devices. Physically the computer buses are, comprised of a set of wires (lines) to which all of the components or devices on the bus are attached. Typically some of the wires are used as control lines for controlling access to the bus and the remainder are used as data lines. The buses used -in the present invention may require some RF shielding in order to improve the signal accuracy.

Figure 5A:
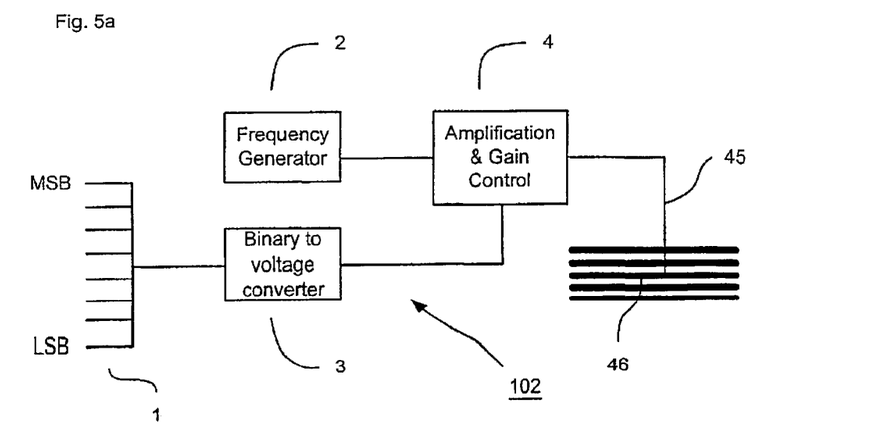
FIG. 5a shows a schematic representation of apparatus according to the second embodiment of the invention for writing data to a computer bus.
Figure 5B:
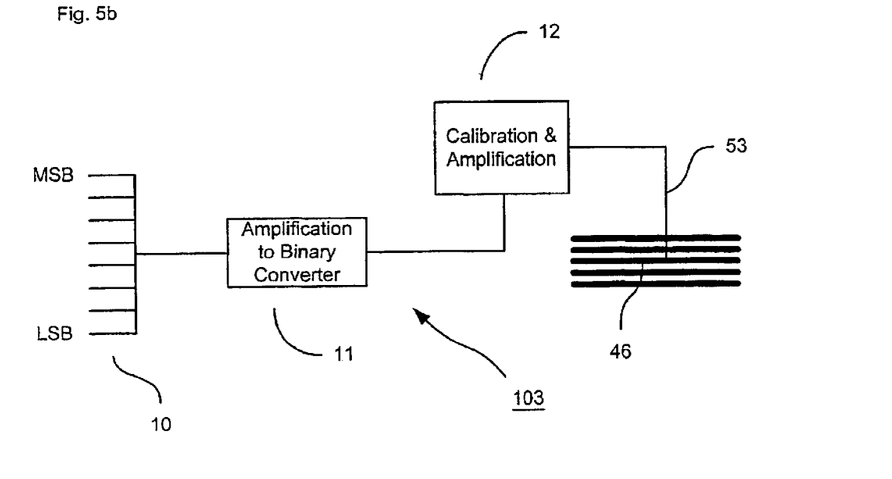
FIG. 5b shows a schematic representation of apparatus according to the second embodiment of the invention for reading data from a computer bus.

The data writing circuit 102 and the data reading circuit 103, shown in FIGS. 5a and 5b respectively, are identical to those used for writing and reading data to a magnetic storage medium described above except for the replacement of transducers 5, 13 by connections 45, 53 to the data bus. Therefore the description thereof is not repeated. Thus, in the data writing circuit 102 the modulated carrier signal which is outputted from the amplification and gain control circuit 4, and represents the inputted data word, is written onto one of the data lines of the bus 46. The signal from the bus 46 is read into the data reading circuit 103 via the calibration and amplification circuit 12. In this manner each line of the bus is capable of transmitting a complete data word rather than either having to transmit the data word one bit at a time or use a several lines to transmit the entire data word in one go., Although not shown in FIGS. 5a and 5b, the data writing circuit 102 and the data reading circuit 103 will also have connections to the bus' control lines.

In a variation of this embodiment the quantized analogue signal may be written directly to the computer bus without modulating a carrier signal. In a further variation of this embodiment the quantized analogue signal may be the amplitude of an electric current rather than the amplitude of a voltage.

Calibration of the circuits 102, 103 may take place either at predetermined time intervals or may be prompted by the bus exceeding a predetermined bit error rate. In the former case the data writing circuit 102 writes predetermined calibration signals to the computer bus at set times. In the latter case the data writing circuit 102 writes a calibration signal to the computer bus in response to a control signal (not shown) from the computer bus. The choice of calibration signal written to the computer bus may also be controlled by the control signal from the computer bus. The data reading circuit 103 reads the calibration signals from the computer bus at the predetermined time, in response to the control signal or a combination of the two. The calibration signals are used in the same way as described for the first embodiment in the amplification to binary converter circuit 11.

As with the embodiment for recording data onto magnetic recording mediums, it is intended that this embodiment of the invention is applicable to the upgrading of existing computer buses as well as to the design of new computer bus systems.

What is claimed is:

1. A method of reading data from a magnetic recording medium, said method comprising:

reading signals recorded on a magnetic medium;

generating data words each having a value which is represented by the amplitude of a read signal;

combining a plurality of data words to form a sequence of data;

wherein said step of generating data words comprises:

comparing the amplitude of the read signals to a plurality of expected signal amplitudes or a plurality of signal amplitude ranges in order to determine which data word is represented by the read signal.

2. A method of reading data from a magnetic recording medium according to claim 1, further comprising:

reading a calibration signal having at least one predetermined amplitude from a predetermined location on said magnetic recording medium;

using the amplitude of the read calibration signal to set at least one of said expected signal amplitudes or said signal amplitude ranges.

3. A method of reading data from a magnetic recording medium according to claim 1, further comprising:

reading a known noise compensation signal from a predetermined location on the magnetic recording medium;

extracting the inherent noise in the noise compensation signal; and adding the inherent noise extracted from the noise compensation signal to the signals read from the magnetic recording medium.

4. A method of reading data from a magnetic recording medium according to claim 3, wherein the extracted inherent noise is stored in an analogue buffer.

5. A method of reading data from a magnetic recording medium according to claim 3, wherein the known noise compensation signal is a calibration signal.

6. A method of reading data from a magnetic recording medium according to claim 3, wherein the known noise compensation signal is read from a portion of the magnetic recording medium on which no signal has been recorded.

7. A method of recording data onto a magnetic recording medium, said method comprising:

arranging data into words of a predetermined length;

generating for each said data word, a signal having an amplitude which is representative of the value of the data word; and recording said signals on the magnetic recording medium;

said method further comprising generating a calibration signal having at least one predetermined amplitude; and recording said calibration signal at a predetermined location on said magnetic recording medium.

8. A method of recording data onto a magnetic recording medium according to claim 7, wherein no signal is recorded on a predetermined portion of the magnetic recording medium.

9. An apparatus for reading data from a magnetic recording medium comprising:

means for reading signals recorded on a magnetic recording medium;

means for generating data words each having a value which is represented by the amplitude of a read signal; and means for combining a plurality of data words to form a sequence of data;

wherein said means for means for generating data words comprises:

means for comparing the amplitude of the read signals to a plurality of expected signal amplitudes or a plurality of signal amplitude ranges in order to determine which data word is represented by the read signal.

10. An apparatus for reading data from a magnetic recording medium according to claim 9, further comprising:

means for causing a calibration signal, having at least one predetermined amplitude, to be read from a predetermined location on said magnetic recording medium; and means for setting at least one of said expected signal amplitudes or said signal amplitude ranges according to the amplitude of the read calibration signal.

11. An apparatus for reading data from a magnetic recording medium according to claim 9, further comprising:

means for causing a known noise compensation signal to be read from a predetermined location on said magnetic recording medium;

means for extracting the inherent noise in the noise compensation signal; and means for adding the inherent noise extracted from the noise compensation signal to the signals read from the magnetic recording medium.

12. An apparatus for reading data from a magnetic recording medium according to claim 11, further comprising an analogue buffer in which the extracted inherent noise is stored.

13. An apparatus for reading data from a magnetic recording medium according to claim 11, wherein the known noise compensation signal is a calibration signal.

14. An apparatus for reading data from a magnetic recording medium according to claim 11, wherein the known noise compensation signal is read from a portion of the magnetic recording medium on which no signal has been recorded.

15. An apparatus for recording data onto a magnetic recording medium, comprising:

means for arranging data into words of a predetermined length;

means for generating, for each said data word, a signal having an amplitude which is representative of the value of the data word; and means for recording said signals on the magnetic recording medium;

further comprising:

means for causing a calibration signal, having at least one predetermined amplitude, to be generated and recorded at a predetermined location on said magnetic recording medium.

16. An apparatus for recording data onto a magnetic recording medium according to claim 15, further comprising:

means for causing no signal to be recorded on a predetermined portion of the magnetic recording medium.

* * * * *